United States Patent
Schmidhammer

(10) Patent No.: US 12,068,738 B2
(45) Date of Patent: Aug. 20, 2024

(54) CONFIGURABLE MICRO-ACOUSTIC RF FILTER

(71) Applicant: RF360 SINGAPORE PTE. LTD, Singapore (SG)

(72) Inventor: Edgar Schmidhammer, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 196 days.

(21) Appl. No.: 17/421,706

(22) PCT Filed: Jan. 21, 2020

(86) PCT No.: PCT/EP2020/051437
§ 371 (c)(1),
(2) Date: Jul. 8, 2021

(87) PCT Pub. No.: WO2020/152183
PCT Pub. Date: Jul. 30, 2020

(65) Prior Publication Data
US 2022/0085794 A1    Mar. 17, 2022

(30) Foreign Application Priority Data
Jan. 25, 2019 (DE) .................... 10 2019 101 888.9

(51) Int. Cl.
*H03H 9/54* (2006.01)
*H03H 9/60* (2006.01)
*H03H 9/64* (2006.01)

(52) U.S. Cl.
CPC ............ *H03H 9/542* (2013.01); *H03H 9/605* (2013.01); *H03H 9/6403* (2013.01); *H03H 9/6483* (2013.01); *H03H 2210/036* (2013.01)

(58) Field of Classification Search
None
See application file for complete search history.

(56) References Cited

U.S. PATENT DOCUMENTS

| 6,426,683 | B1 * | 7/2002 | Gu ..................... H03H 7/1758 336/200 |
| 9,209,775 | B2 * | 12/2015 | Ebihara ............... H03H 7/465 |
| 9,860,006 | B1 | 1/2018 | Okuda |
| 2004/0119561 | A1 | 6/2004 | Omote |
| 2013/0033337 | A1 | 2/2013 | Nishihara et al. |
| 2014/0167877 | A1 * | 6/2014 | Shimizu .............. H03H 7/463 333/101 |
| 2018/0019730 | A1 | 1/2018 | Takeuchi et al. |
| 2019/0280669 | A1 | 9/2019 | Mori et al. |

FOREIGN PATENT DOCUMENTS

| EP | 1045517 A2 | 10/2000 |
| WO | 2017122052 A1 | 7/2017 |
| WO | 2018105193 A1 | 6/2018 |

OTHER PUBLICATIONS

International Search Report and Written Opinion—PCT/EP2020/051437—ISA/EPO—dated Jun. 25, 2020.
Partial International Search Report—PCT/EP2020/051437—ISA/EPO—dated Apr. 29, 2020.

* cited by examiner

*Primary Examiner* — Kenneth B Wells
(74) *Attorney, Agent, or Firm* — Polsinelli LLP

(57) ABSTRACT

A configurable micro-acoustic RF filter comprises first and second filter subsections (140, 150) and at least one switch (160) to selectively bypass or activate the second filter subsection (150). The filter sections include at least one serially connected and at least one shunt connected micro-acoustic resonator.

15 Claims, 5 Drawing Sheets

CONFIGURABLE MICRO-ACOUSTIC RF FILTER

TECHNICAL FIELD

The present disclosure relates to a micro-acoustic RF filter. Specifically, the present disclosure relates to a micro-acoustic RF filter that includes subsections of serially and shunt connected micro-acoustic resonators.

BACKGROUND

Micro-acoustic RF filters are widely used in electronic communication systems to select the wanted signal from the received signal spectrum or shape the transmit signal. The RF filter should provide an as low as possible insertion loss in the passband to reduce the overall RF losses and requires a large out-of-band attenuation to avoid crosstalk or allow parallel use of different services such as 4G/5G services and WLAN services at the same time. Since the insertion loss within the passband and the out-of-band attenuation in the stopband region out of the passband are related to each other, both requirements such as low insertion loss and high out-of-band attenuation are difficult to achieve.

Conventional communication devices such as a smartphones may use one filter with low insertion loss and reasonable out-of-band attenuation which is activated, when no interference signal is present in the stopband region, and another filter having a large out-of-band attenuation and correspondingly more insertion loss in the passband which is activated, when an interference signal is present in the stopband. A switch may select one of the two parallel filters in dependence on the attenuation requirements in the stopband region. However, this solution requires two parallel RF filters which is space-consuming and expensive.

It is an object of the present disclosure to provide a micro-acoustic RF filter that selectively allows low insertion loss or high out-of-band attenuation at less costs.

It is another object of the present disclosure to provide a micro-acoustic RF filter that selectively allows low insertion loss or high out-of-band attenuation that consumes less space.

It is yet another object of the present disclosure to provide a communication device with a RF filter that selectively allows low insertion loss or high out-of-band attenuation at less costs.

SUMMARY

According to the present disclosure, one or more of the above-mentioned objects are achieved with a configurable micro-acoustic RF filter comprising the features of present claim 1.

The micro-acoustic RF filter according to the present disclosure includes a first and a second port, first and second filter subsections and a switch. The switch selects between the first filter subsection and a concatenation of the first and second filter subsections so that the micro-acoustic RF filter is configurable in dependence on attenuation requirements. The switches are positioned close to the filter sections. The first and second filter subsections each include at least one serially connected and at least one shunt connected micro-acoustic resonator. Specifically, the first and second filter subsections may have the same structure or include identical circuits. The first and second filter subsections are symmetrical so that their concatenation leads to a the micro-acoustic RF filter of ladder-type shape. The filter is configurable to exhibit a first filter length or a second filter length corresponding to the selection of the first filter subsection only or the concatenation of first and second filter subsections. Accordingly, the filter is configurable to provide a lower attenuation in the stopband and correspondingly in the passband or a higher attenuation in the stopband and the passband.

According to embodiments, the configurable micro-acoustic RF filter may comprise a first port and a second port only which requires another switch to either select the second filter subsection or bypass the second filter subsection depending on the switch state of the switch and the other switch. When bypassing the second filter subsection, the first filter subsection is only active between the first and second port. When selecting the second subsection, the concatenation of the first and second filter subsections is activated between the first and second ports. Alternatively, a third port may be provided which is connected to the switch so that the switch may select the first filter subsection only between the first and third ports or allow the concatenation of first and second filter subsections between the first and second ports.

According to embodiments, a shunt connected inductance may be coupled to the third terminal of the switch to compensate the parasitic capacitance of the switch relative to ground potential. When the other switch is used, also another shunt connected inductance may be coupled to the other switch to compensate the parasitic capacitance of that switch relative to ground potential. The shunt connected compensation inductances are provided at those terminals of the switches that are connected to the second filter subsection. The inductance value of the shunt connected inductance(s) is obtained by a narrow band approximation such that it compensates or substantially compensates the parasitic capacitance of the switch. The inductance value of the shunt connected compensation inductances may be represented as L with $$L=1/(\omega^2 * 2Cp),$$

to achieve an ideal compensation of the parasitic capacitances of the switches. Alternatively, L may be set to $$L=1/(\omega^2 * 2Cp) \pm 20\%$$

so that the inductance is within range of ±20% of the ideal value to at least substantially compensate the parasitic capacitances of the switches. The term ω represents the angular frequency of the frequency of interest such as the frequency at which the compensation is to be applied. This inductor can also be used to improve the matching of the RF filter so that the term ω may represent the frequency which provides a good result for matching of the entire filter. Accordingly, the term ω may represent the angular frequency at which compensation is to be applied or where a good result for the matching of the entire filter is achieved or a combination of both. The term 2 Cp represents the capacitance value of the parasitic capacitances of each of the switches.

According to embodiments, the first and second filter subsections should be symmetrical with respect to their first and second terminals. The first and second filter subsections may either comprise a TEE-configuration or a PI-configuration. A first and second filter subsection of the TEE-configuration may comprise two serially connected micro-acoustic resonators and a shunt connected micro-acoustic resonator connected to the node between the two serially connected resonators. Either one of the ports of the TEE-configuration filter section provides a serial and a shunt resonator so that the TEE-configuration is symmetric.

The first and second filter subsections of a PI-configuration may comprise a serially connected micro-acoustic resonator and corresponding shunt connected micro-acoustic resonators connected to the two terminals of the serially connected micro-acoustic resonator. Either one of the ports of the PI-configuration filter section provides a shunt and a serial resonator so that the PI-configuration is symmetric.

In case of a PI-configuration, the shunt connected resonators may be dimensioned such that the capacitance value is less than usual so that it has reduced capacitance in order to compensate the parasitic capacitance of the switches which are connected to the PI-configuration resonator. Alternatively, compensation inductances are also possible. Furthermore, inductances may provide for filter matching.

According to embodiments, one or more additional filter sections may be cascaded between the other filter subsection and the other switch connected to the second port. The one or more additional filter sections are added through one or more additional switches to enable the activation of the corresponding additional filter section or bypassing it. Specifically, a third and a fourth switch may be provided enabling a bypass channel or enabling a third filter subsection so that a third level of stopband attenuation may be activated in dependence on operating requirements.

One or more of the above-mentioned objects are also achieved by a communication device comprising the features of claim 13.

The communication device comprises one of the above-described configurable micro-acoustic RF filters and a detector that detects the signal of an interferer in the stopband region of the RF filter. The detector is configured to generate a detection signal that indicates the presence or absence of the interference signal. The switches of the configurable RF filter are controlled and set in dependence on the state of the detection signal.

The communication device allows a moderate stopband attenuation when an interferer is not detected in the stopband. The insertion loss within the passband which corresponds to the stopband attenuation is at relatively low level and the received signal strength of the wanted signal is assumed to be large. When an interferer is detected, one or more filter subsections are activated to increase stopband attenuation and block the interference signal. In this case, the insertion loss within the passband is larger which may require additional amplification of the wanted signal to achieve a sufficient signal strength for further processing within the receive circuitry of the communication device. In this configuration, additional stopband attenuation for blocking of the interferer signal is achieved at cost of more insertion loss in the passband and more power consumption for amplification of the receive signal. A configurable micro-acoustic RF filter according to the present disclosure allows adaptive reception to avoid crosstalk or interference by another RF service while saving realization space and number of filter components for the realization of the configurable RF filter.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
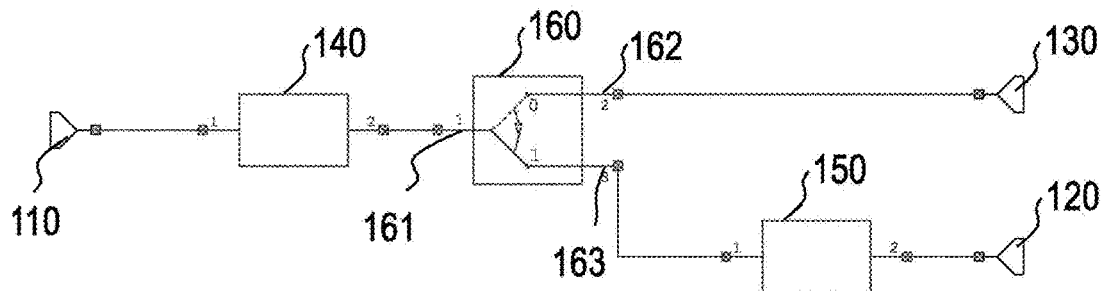
FIG. 1 shows a block diagram of a configurable micro-acoustic RF filter.

FIG. 1 shows a block diagram of a configurable micro-acoustic RF filter according to the principles of the present disclosure. The RF filter comprises a first port 110, a second port 120 and a third port 130. A first filter subsection 140 is connected to port 110. Another terminal of filter section 140 is connected to a switch 160. Switch 160 comprises three ports 161, 162, 163 wherein port 161 can be selectively coupled to one of ports 162, 163 in dependence on a control signal applied to the switch 160. The switch 160 is a so-called SP2T circuit (SP2T: single pole double through). Port 163 of switch 160 is connected to a second filter subsection 150 which is further connected to the second filter port 120. The second port 162 of switch 160 is connected to the third filter port 130.

During operation, switch 160 may be controlled to connect ports 161 and 162 so that only filter section 140 is active between filter ports 110, 130. Alternatively, switch 160 may be controlled to couple ports 161 and 163 so that the concatenation or serial connection of filter subsections 140, 150 is active between filter ports 110, 120.

Filter sections 140, 150 are preferably of the same structure. Filter sections 140, 150 may be symmetric so that the impedance seen through either terminal of the sections is identical. Sections 140, 150 comprise at least one serially connected micro-acoustic resonator and at least one shunt connected micro-acoustic resonator which is connected between one terminal of the serially connected resonator and a terminal for ground potential. Preferably, the sections 140, 150 are either circuits having a TEE-configuration or circuits having a PI-configuration as explained in more detail herein below.

Figure 2:
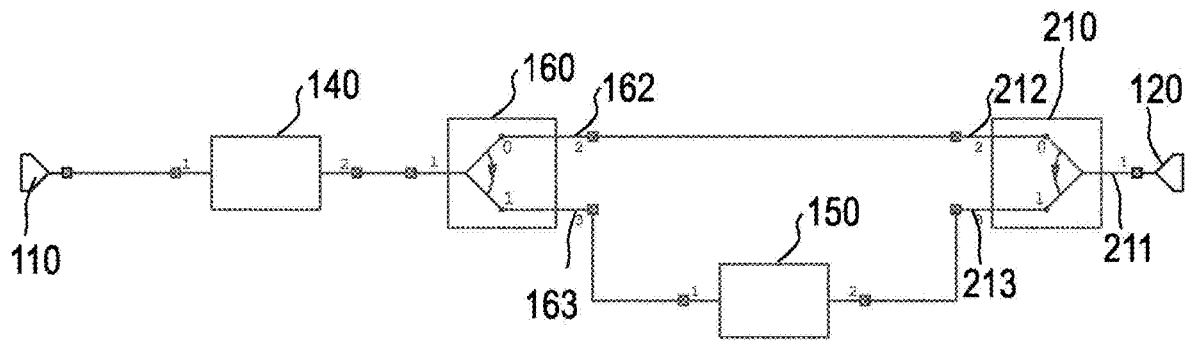
FIG. 2 shows a block diagram of another configurable micro-acoustic RF filter.

FIG. 2 shows a block diagram of another embodiment of a configurable micro-acoustic RF filter. The filter of FIG. 2 comprises a third switch 210 having a first terminal 211 connected to port 120, a second terminal 212 connected to the second terminal 162 of switch 160 and a third terminal 213 connected to filter section 150. With switches 160, 210 coupling terminals 162, 212, filter section 150 is bypassed so that only filter section 140 is active between ports 110, 120. Selecting switches 160, 210 so that terminals 163, 213 are enabled, the concatenation of filter sections 140, 150 is active between ports 110, 120. Switches 160, 210 are close to the to be switched filter section 150 within the filter.

Figure 3:
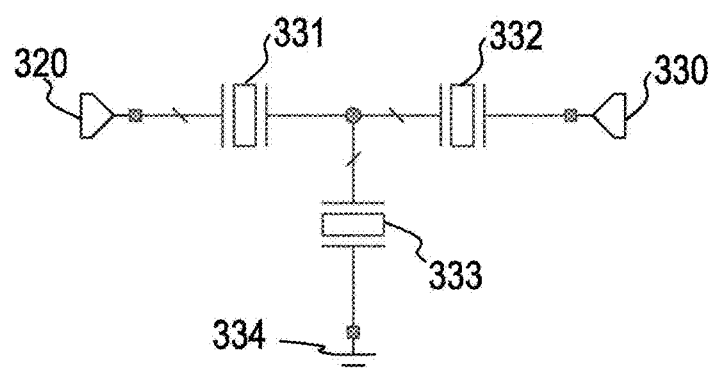
FIG. 3 shows a filter subsection according to a TEE-configuration.

FIG. 3 depicts a filter subsection according to a TEE-configuration. The TEE-configuration section comprises a serial connection of a first and a second resonator 331, 332 disposed between two ports 320, 330. The node between resonators 331, 332 is coupled to ground terminal 334 by a shunt resonator 333. The serial resonators 331, 332 may be represented by "S" and the shunt resonator 333 may be represented by "P" so that a TEE-section comprises a S-P-S topology. The TEE-configuration section is symmetric at both ports 320, 330 so that a larger filter composed of two or more concatenated TEE-configuration sections has a ladder-type configuration. The filter sections 140, 150 of FIGS. 1 and 2 may comprise one TEE-configuration section as depicted in FIG. 3. More than one TEE-configuration section within filter sections 140, 150 are also possible.

Figure 4:
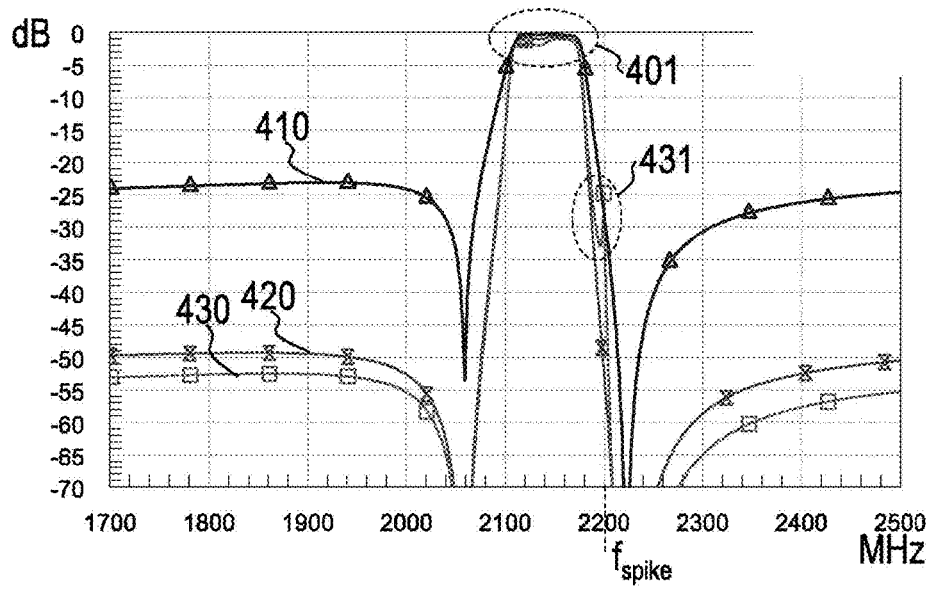
FIG. 4 shows a transmission diagram depicting transmission curves of configurations of the RF filter of FIG. 2 using TEE-subsections.

Turning now to FIG. 4, a transmission diagram is shown which depicts transmission curves 410, 430 of different switched configurations of the filter of FIG. 2 when filter sections 140, 150 are realized as TEE-sections such as shown in FIG. 3. A comparative transmission curve 420 is also depicted in FIG. 4. Specifically, transmission curve 410 depicts the transmission of the filter of FIG. 2, when the S-P-S topology of filter 140 is selected so that switches 160, 210 bypass section 150.

Transmission curve 420 represents the curve for a reference or comparative ladder-type topology without switches such as a S-P-S-P-S topology which may be a concatenation of a S-P-S filter and another S-P-S filter. Transmission curve 430 represents the filter of FIG. 2, wherein switches 160, 210 are configured such that sections 140, 150 are active between ports 110, 120 resulting in a selected S-P-S-P-S configuration. As can be gathered from FIG. 4, the transmission curve 420 has a higher attenuation in the stopband region than curve 410 because the higher order ladder-type topology increases the stopband attenuation. In the passband region 401, the curve 420 is slightly below curve 410 so that the insertion loss is increased. As can be gathered from FIG. 4, the matching of the filter of curve 430 is worse than compared to the filter of curve 420 which may be due to the parasitic capacitances to ground potential resulting from the switches 160, 210. Also, a spike at region 431 is visible which is also a result of the parasitic capacitances of the switches 160, 210 to ground potential. On the other hand, the configurable micro-acoustic RF filter of FIG. 2 allows an increase of attenuation from curve 410 to curve 430 in the stopband region, useful for the case that an interference signal may be present in the stopband region that needs to be suppressed. This may be the case when a crosstalk from another channel is present in the received spectrum or another service such as a WLAN signal is present in the stopband region. In this case the switches 160, 210 are selected such that filter sections 140, 150 are active and concatenated to achieve a higher out-of-band attenuation according to curve 430 and to suppress the WLAN signal while receiving the wanted signal of the passband 401.

Figure 5:
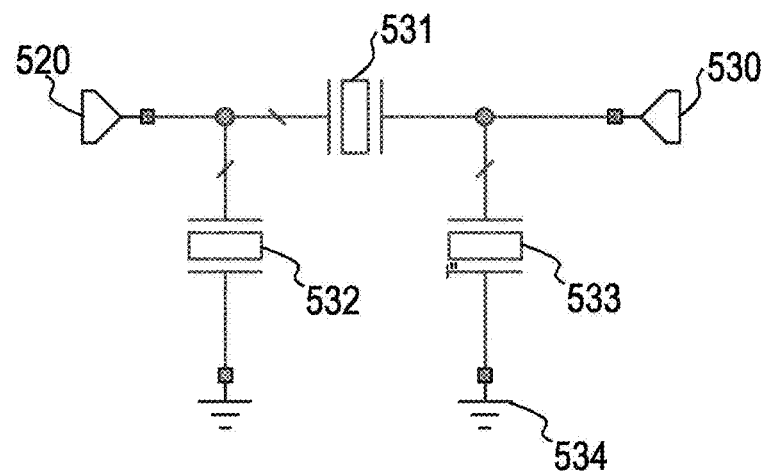
FIG. 5 shows a filter subsection having a PI-configuration.

FIG. 5 shows a filter subsection according to a PI-configuration that may be used for filter sections 140, 150. The PI-section of FIG. 5 comprises first and second ports 520, 530 and a serially connected resonator 531 disposed between ports 520, 530. First and second shunt connected resonators 532, 533 are connected from the terminals of serial resonator 531 to ground terminal 534.

Figure 6:
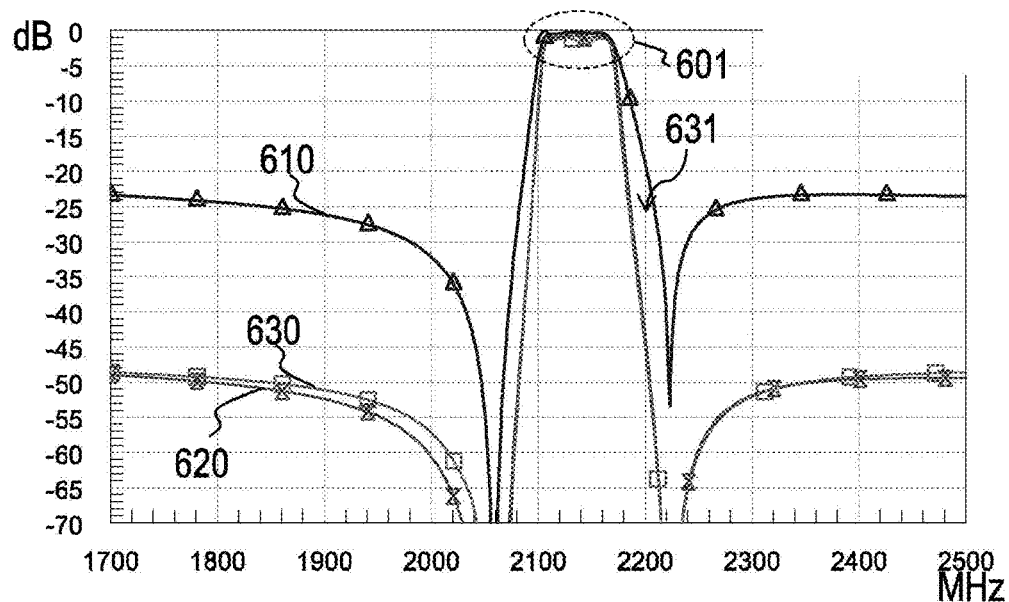
FIG. 6 shows a transmission diagram depicting transmission curves of configurations of the RF filter of FIG. 2 using PI-subsections.

Turning now to FIG. 6, transmission curves are depicted for the filter of FIG. 2 with filter sections 140, 150 realized as PI-sections such as shown in FIG. 5. Transmission curve 610 depicts a P-S-P topology for filter 140 when switches 160, 210 bypass section 150. Curve 620 represents a P-S-P-S-P topology as reference or comparative example without any switches. Curve 630 represents the transmission curve of the filter of FIG. 2 with PI-configuration sections in filter sections 140, 150 wherein the switches 160, 210 are selected such that sections 140, 150 are concatenated and are active between ports 110, 120. The state of switches 160, 210 is such that terminals 163, 213 are enabled. Curve 630 exhibits a high out-of-band attenuation close to comparative curve 620 for the comparative ladder-type topology without switches. In the passband region 601, the selected higher order ladder-type structure has a higher insertion loss than the lower order ladder-type structure. It is to be noted that the use of PI-blocks for filter sections 140, 150 avoids a spike at the upper skirt of the passband at region 631 different from the embodiment where TEE-blocks are used as shown in FIG. 4.

Although the switches 160, 210 have parasitic capacitances relative to ground potential, these capacitances are disposed in parallel to the leading and trailing resonators 532, 533 of the PI-configuration block within filter section 150 so that the parasitic effect does not occur in the transmission curve. On the other hand, adding inductors in the PI-configuration may improve the matching of the filter.

Figure 7A:
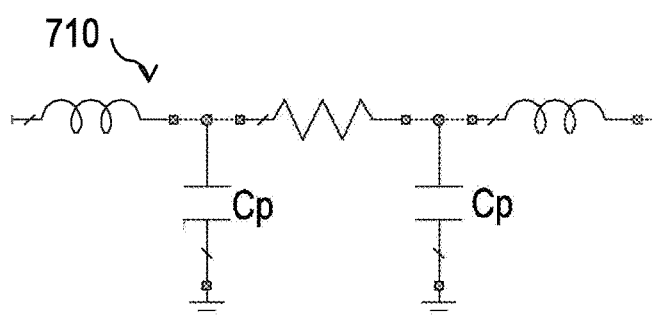
FIGS. 7A and 7B show a simplified model of a switch with lumped elements and a compensation inductor to compensate the parasitic capacitance of the switch, respectively.
Figure 7B:
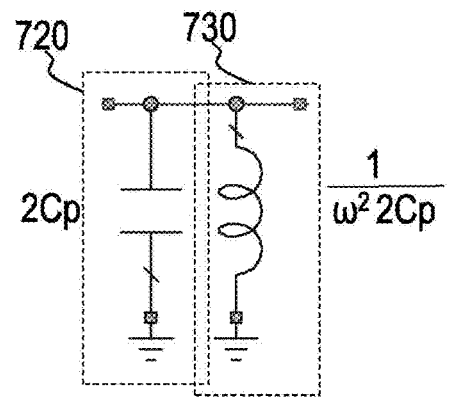

Turning now to FIGS. 7A and 7B, the effect of the parasitic capacitance of the switches and a solution for compensating it is shown. FIG. 7A depicts a simplified model with lumped elements for switches 160, 210. The simplified model comprises a circuit 710 including a serial connection of an inductor, a resistor and another inductor with two shunt capacitors each having a capacitance Cp. The serial inductors have relatively small inductance such as about 0.25 nH and the serial resistor has a relatively small resistance value in the range of about 1.0 n. Accordingly, the serial path may be almost neglected so that the resulting element is the parallel connections of the two capacitors resulting in an overall parasitic capacitance of 2 Cp.

In FIG. 7B, the paracitic capacitance of a switch is represented at 720. The parasitic shunt capacitor 720 is responsible for spike 431 at a frequency $f_{spike}$ at about 2200 MHz in FIG. 4. It may be eliminated with a compensation element such as a negative capacitance connected in parallel to parasitic capacitance 720 or a narrow band approximation of such a negative capacitance that is an inductor. The inductance value of the inductor according to the narrow band approximation is $1/(\omega^2\, 2Cp)$ in the ideal case. In practice, the inductance L of the compensating inductor 730 is from a range of $1/(\omega^2\, 2Cp)\pm 20\%$. The angular frequency ω represents the frequency where the spike 431 is located with is at about 2200 MHz in the case of FIG. 4.

Figure 8:
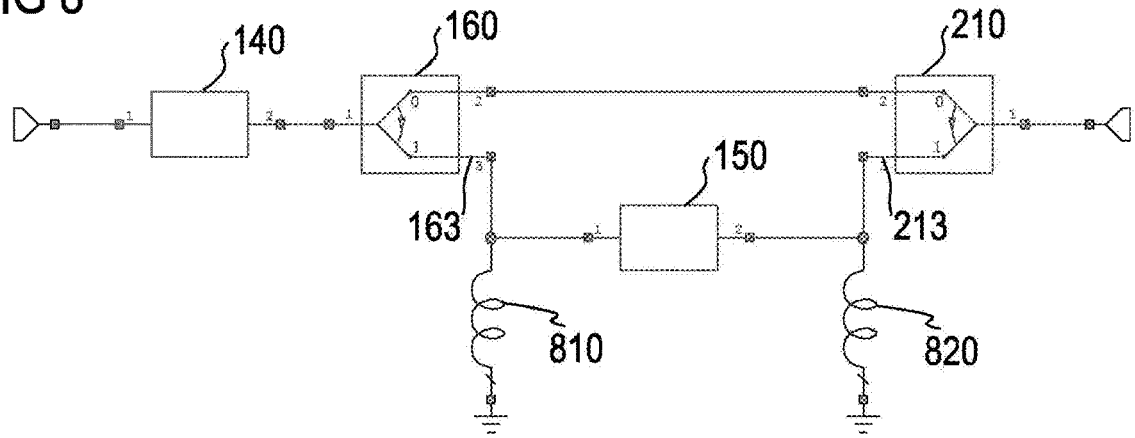
FIG. 8 shows a configurable micro-acoustic RF filter using compensation inductors.
Figure 9:
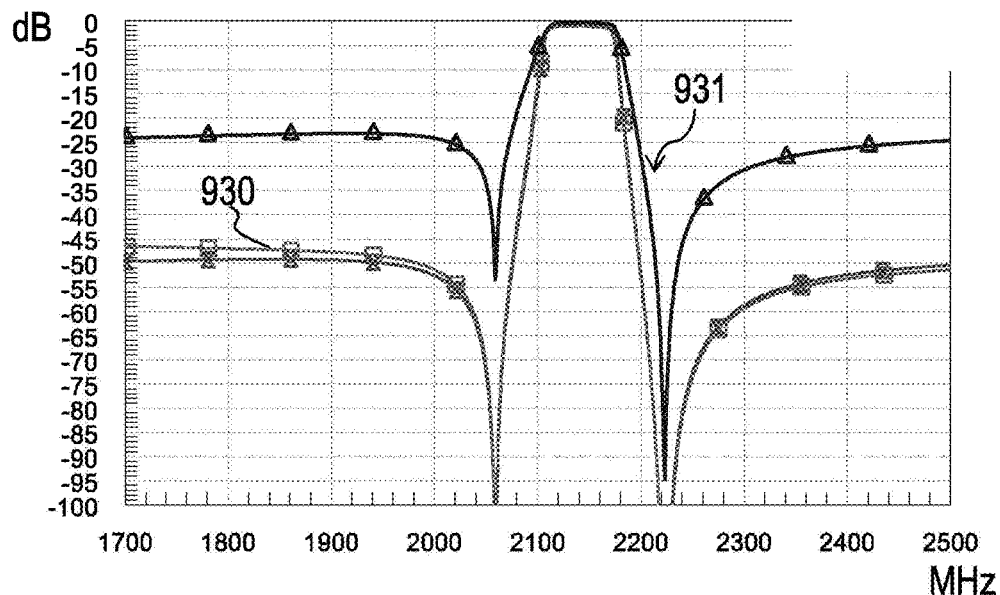
FIG. 9 shows a transmission diagram depicting transmission curves for configurations of the RF filter of FIG. 8.

FIG. 8 depicts a block diagram of a configurable micro-acoustic RF filter using compensation inductors. The filter of FIG. 8 has the basic structure of the filter depicted in FIG. 2 with additional inductors 810, 820 are connected from the nodes between terminals 163 and 213 of switches 160, 210 and the corresponding terminals of filter section 150 to the terminal for ground potential. The compensation inductors 810, 820 are dimensioned according to the rule explained in connection with FIG. 7B to compensate the parasitic capacitances 2 Cp of switches 160, 210. The result of compensation can be determined from the transmission diagram depicted in FIG. 9 which is based on TEE-sections for sections 140, 150 so that it corresponds to the transmission diagram shown in FIG. 4 for the uncompensated case. As can be gathered from FIG. 9, the upper right skirt of the passband of curve 930 is flat at region 931 so that it includes no spike. While compensation inductors 810, 820 are specifically useful to compensate a spike that is introduced by TEE-sections in filter sections 140, 150, such compensation inductors can also be used in connection with PI-sections realizing the filter sections 140, 150 helping to improve the matching of the overall filter. The inductance of the inductor may be calculated according to the above-mentioned formulas, wherein the term ω represents the angular frequency where a good result for the matching of the entire filter is achieved.

Figure 10:
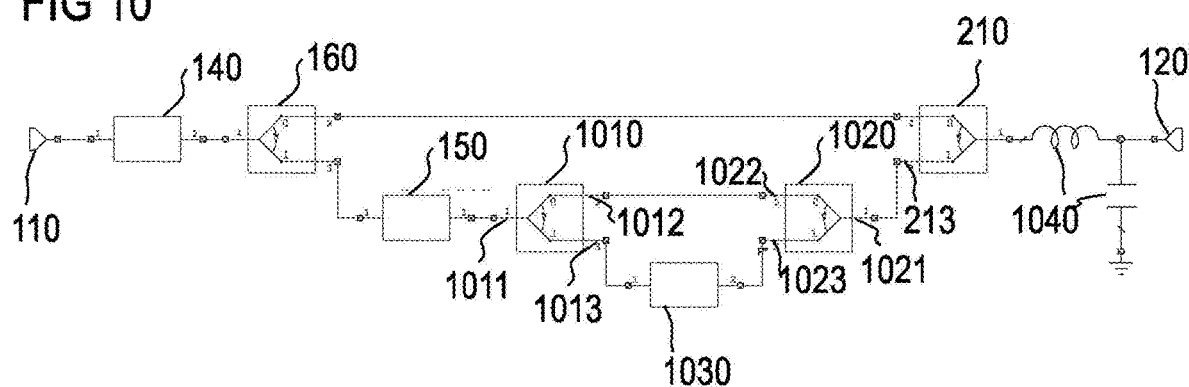
FIG. 10 shows a block diagram of yet another configurable micro-acoustic RF filter.

FIG. 10 shows a block diagram wherein an additional filter section 1030 is cascaded with filter sections 140, 150 through corresponding switches 1010, 1020 that enable the activation of additional filter section 1030 or a bypass. Specifically, switch 1010 has a terminal 1011 connected to filter section iso. Switch 1020 is connected to terminal 213 of switch 210 at its terminal 1021. Terminals 1012, 1022 of switches 1010, 1020 are connected with each other to enable a bypass of filter section 1030. Terminals 1013, 1023 of switches 1010, 1020 are connected to third filter section 1030. Even an additional order of concatenation is possible using another filter stage and leading and trailing switches between filter section 1030 and terminal 1023 of switch 1020 (not shown in FIG. 10). FIG. 10 shows also an example of a matching network 1040 of a serial inductor and a shunt connected capacitor connected between switch 210 and external port 120.

Figure 11:
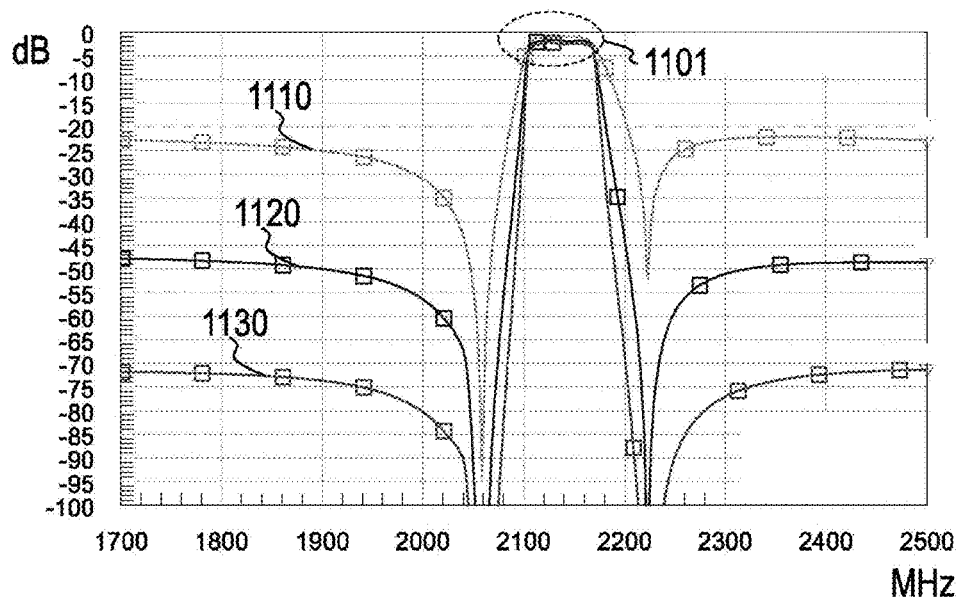
FIG. 11 shows a transmission diagram depicting transmission curves for configurations of the RF filter of FIG. 10.

Depending on the detection of an interfering signal switches 160, 1010, 1020, 210 are selected either in a bypass state or in a state where one or more of the additional filter sections 150, 1030 are selected. The configurations of the filter of FIG. 10 are explained in connection with the transmission diagram of FIG. 11. In a first configuration P1 switches 160, 210 are selected such that the additional filter sections 150, 1030 are bypassed so that only filter section 140 is active between external ports 110, 120 forming a P-S-P ladder type filter configuration in an example when PI-sections are used. The transmission curve for this configuration is depicted at 1110 which has the lowest level of attenuation in the stopband region and the lowest insertion loss in the passband region 1101. The second configuration P2 is such that switch 160 enables second filter section 150, and switches 1010, 1020 bypass filter section 1030 forming a P-S-P-S-P ladder type filter configuration in this example. The corresponding transmission curve is depicted at 1120 which has an increased stopband attenuation and increased insertion loss in the passband. In the third configuration P3, switches 1010, 1020 are selected such that third filter section 1030 is enabled so that the filter of FIG. 10 is a concatenation of filter subsections 140, 150, 1030, which is a P-S-P-S-P-S-P laddertype filter configuration in this example. The corresponding transmission curve is depicted at 1130 showing an even higher stopband attenuation and also an even increased insertion loss in passband region 1101. As can be gathered from FIGS. 10 and 11, a corresponding setting of the switches in the configurable micro-acoustic RF filter allows a selection of three different attenuation levels in dependence on a detected level of interference in the stopband region. A detector in a communication device may determine the interference level and select one of the three possible configurations P1, P2, P3 and attenuation levels 1110, 1120, 1130 to achieve sufficient suppression of the interferer. The detector generates a corresponding detection signal that indicates the level of presence or the absence of the interferer and sets the switches in dependence on the detection signal. The insertion loss, however, in the passband is also increased with increasing stopband attenuation so that more electrical power may be needed to amplify the signal at terminal 120 to a desired level to make it suitable for further processing of the signal is possible in the downstream connected reception circuitry. While an increased attenuation requires increased power consumption, the power consumption is reduced when the interference level is less or no interferer is detected so that either transmission curves 1120 or 1110 are selected.

The resonators 140, 150, 1030 may be realized with an acoustic filter technology, wherein the switches 160, 1010, 1020, 210 may be realized as semiconductor switches in semiconductor CMOS technology. The die containing the switches may be positioned on top of the die for the acoustic filters to keep the parasitics as small as possible. The acoustic filters may be composed of micro-acoustic resonators such as surface acoustic wave resonators and/or bulk acoustic wave resonators employing a piezoelectric substrate known to a person skilled in the art.

Figure 12A:
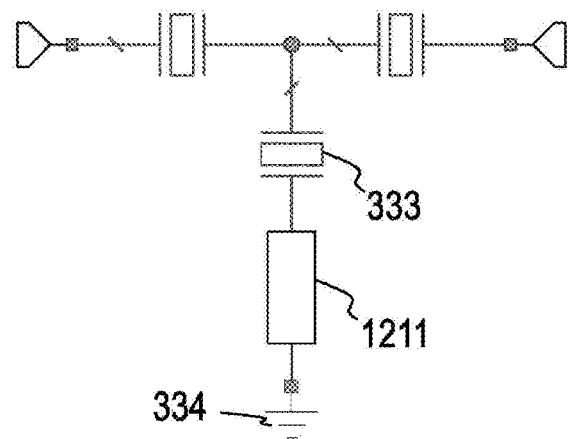
FIGS. 12A and 12B shows a variant to realize a filter subsection according to a TEE-configuration and a PI-configuration, resp.

FIG. 12A depicts a filter subsection according to an other realization of a TEE-configuration. The subsection includes an impedance element 1211 which is connected between shunt resonator 333 and ground terminal 334. Impedance element 1211 is connected serially with shunt resonator 333. Impedance element 1211 may be formed by an inductor to introduce a finite transmission zero in the filter transfer function.

Figure 12B:
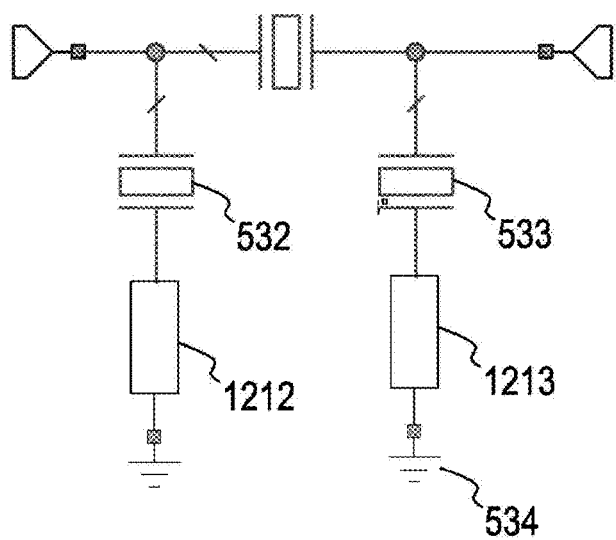

FIG. 12B depicts a filter subsection according to another realization of a PI-configuration. A corresponding impedance element 1212 and 1213 is connected between shunt resonators 532 and 533, resp, and ground terminal 534. The impedance elements 1212, 1213 may be formed by inductors to introduce a finite transmission zero in the filter transfer function. The above-mentioned alternative TEE- and PI-sections can be used for filter subsections 140, 150 and 1030.

In summary, a configurable micro-acoustic RF filter can be composed of a series cascade of individual filter subsections such as TEE or PI-blocks, wherein a TEE-block has a S-P-S configuration and a PI-block has a P-S-P configuration. The switches within the filter topology either bypass filter sections or add filter sections towards a minimum filter. The switches are disposed within the filter close to the two or more filter subsections and select the needed amount of out-of-band attenuation in response to the detection of an interfering signal.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. A configurable micro-acoustic RF filter, comprising:
a first port and a second port;
a first filter subsection including at least one serially connected micro-acoustic resonator and at least one shunt connected micro-acoustic resonator, the first filter subsection coupled to the first port;
a switch having a first terminal connected to the first filter subsection, a second terminal and a third terminal;
a second filter subsection including at least one serially connected micro-acoustic resonator and at least one shunt connected micro-acoustic resonator, the second filter subsection coupled to the third terminal of the switch and to the second port; and
an additional switch having a first terminal coupled to the second port, a second terminal coupled to the second terminal of the switch, and a third terminal coupled to the second filter subsection.

2. The configurable micro-acoustic RF filter according to claim 1, further comprising a third port connected to the second terminal of the switch.

3. The configurable micro-acoustic RF filter according to claim 1, further comprising a shunt connected inductance coupled to the third terminal of the switch.

4. The configurable micro-acoustic RF filter according to claim 3, the shunt connected inductance configured to compensate a parasitic capacitance of the switch or to improve matching of the RF filter.

5. The configurable micro-acoustic RF filter according to claim 3, the inductance having an inductance value L of $L=1/(\omega 2*2Cp)$ or of $L=1/(\omega 2*2Cp)\pm 20\%$, wherein ω represents an angular frequency at which compensation is to be applied or matching of the RF filter is achieved and 2 Cp represents a capacitance value of a parasitic capacitance of the switch.

6. The configurable micro-acoustic RF filter according to claim 1, further comprising a shunt connected inductance coupled to the third terminal of the additional switch and configured to compensate for a parasitic capacitance of the additional switch relative to ground potential.

7. The configurable micro-acoustic RF filter according to claim 1, the first and second filter subsections each having a first and a second terminal and each being symmetrical with respect to the first and second terminals.

8. The configurable micro-acoustic RF filter according to claim 1, wherein the first and second filter subsections each comprise a TEE-configuration comprising:
the serially connected micro-acoustic resonator having a terminal;
the shunt connected micro-acoustic resonator coupled between the terminal of the serially connected micro-acoustic resonator and a terminal for ground potential; and
another serially connected micro-acoustic resonator connected to the terminal of the serially connected micro-acoustic resonator.

9. The configurable micro-acoustic RF filter according to claim 1, wherein the first and second filter subsections each comprise a PI-configuration comprising:
the serially connected micro-acoustic resonator having a first terminal and a second terminal;
the shunt connected micro-acoustic resonator coupled between the first terminal of the serially connected micro-acoustic resonator and a terminal for ground potential; and
another shunt connected micro-acoustic resonator coupled between the second terminal of the serially connected micro-acoustic resonator and the terminal for ground potential.

10. The configurable micro-acoustic RF filter according to claim 9, wherein the shunt connected micro-acoustic resonator or the second shunt connected micro-acoustic resonator are configured with reduced capacitance to compensate a parasitic capacitance of the switch or the additional switch.

11. The configurable micro-acoustic RF filter according to claim 1, further cascading one or more additional filter subsections through one or more additional switches between the first filter subsection and the additional switch.

12. The configurable micro-acoustic RF filter according to claim 1, further comprising a third switch, a fourth switch and a third filter subsection, the third switch having a first terminal coupled to the second filter subsection, a second terminal and a third terminal, the third terminal coupled to the third filter subsection, the fourth switch having a first terminal coupled to the third terminal of the additional switch, a second terminal coupled to the second terminal of the third switch and a third terminal coupled to the third filter subsection.

13. The configurable micro-acoustic RF filter according to claim 1, wherein the configurable micro-acoustic RF filter is part of a communication device, the communication device comprising a detector configured to detect an interferer in a stopband region of the RF filter and configured to generate a detection signal indicating one of presence and absence of the interferer, setting switches of the RF filter in dependence on the detection signal.

14. A configurable micro-acoustic RF filter, comprising:
a first port and a second port;
a first filter subsection including at least one serially connected micro-acoustic resonator and at least one shunt connected micro-acoustic resonator, the first filter subsection coupled to the first port;
a switch having a first terminal connected to the first filter subsection, a second terminal and a third terminal; and
a second filter subsection including at least one serially connected micro-acoustic resonator and at least one shunt connected micro-acoustic resonator, the second filter subsection coupled to the third terminal of the switch and to the second port; and
an impedance element connected between the at least one shunt connected micro-acoustic resonator and the terminal for ground potential;
wherein the first and second filter subsections comprise a TEE-configuration comprising:
the serially connected micro-acoustic resonator having a terminal;
the at least one shunt connected micro-acoustic resonator coupled between the terminal of the serially connected micro-acoustic resonator and a terminal for ground potential; and
another serially connected micro-acoustic resonator connected to the terminal of the serially connected micro-acoustic resonator.

15. A configurable micro-acoustic RF filter, comprising:
a first port and a second port;
a first filter subsection including at least one serially connected micro-acoustic resonator and a first shunt connected micro-acoustic resonator, the first filter subsection coupled to the first port;
a switch having a first terminal connected to the first filter subsection, a second terminal and a third terminal;
a second filter subsection including at least one serially connected micro-acoustic resonator and a second shunt connected micro-acoustic resonator, the second filter subsection coupled to the third terminal of the switch and to the second port; and
an impedance element connected between the first shunt connected micro-acoustic resonator and the terminal for ground potential; and
an additional impedance element connected between the second shunt connected micro-acoustic resonator and the terminal for ground potential;
wherein the first and second filter subsections each comprise a PI-configuration, with the PI-configuration comprising:
the serially connected micro-acoustic resonator having a first terminal and a second terminal;
the shunt connected micro-acoustic resonator coupled between the first terminal of the serially connected micro-acoustic resonator and a terminal for ground potential; and
another shunt connected micro-acoustic resonator coupled between the second terminal of the serially connected micro-acoustic resonator and the terminal for ground potential.

* * * * *